(12) United States Patent
Pan et al.

(10) Patent No.: US 9,728,543 B1
(45) Date of Patent: Aug. 8, 2017

(54) SEMICONDUCTOR STRUCTURE AND FABRICATING METHOD THEREOF

(71) Applicant: TAIWAN SEMICONDUCTOR MANUFACTURING CO., LTD., Hsinchu (TW)

(72) Inventors: Chia-Ming Pan, Tainan (TW); Chiang-Ming Chuang, Changhua County (TW); Kun-Tsang Chuang, Miaoli County (TW); Po-Wei Liu, Tainan (TW); Yong-Shiuan Tsair, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/236,533

(22) Filed: Aug. 15, 2016

(51) Int. Cl.
| | | |
|---|---|---|
| H01L 29/788 | (2006.01) |
| H01L 27/11526 | (2017.01) |
| H01L 29/66 | (2006.01) |
| H01L 21/8234 | (2006.01) |
| H01L 21/311 | (2006.01) |

(Continued)

(52) U.S. Cl.
CPC .. *H01L 27/11526* (2013.01); *H01L 21/31144* (2013.01); *H01L 21/32139* (2013.01); *H01L 21/823437* (2013.01); *H01L 21/823468* (2013.01); *H01L 21/823481* (2013.01); *H01L 27/11521* (2013.01); *H01L 29/6656* (2013.01); *H01L 29/66545* (2013.01); *H01L 29/788* (2013.01)

(58) Field of Classification Search
CPC ........... H01L 27/11526; H01L 21/3114; H01L 21/32139; H01L 21/823437; H01L 21/823468; H01L 21/823481; H01L 29/66545; H01L 29/6656; H01L 29/788
USPC .......... 257/532–535; 438/239–256, 393–399
See application file for complete search history.

(56) References Cited

U.S. PATENT DOCUMENTS

| | | | |
|---|---|---|---|
| 6,355,524 B1 * | 3/2002 | Tuan ................. | H01L 21/31053 257/E21.244 |
| 8,008,731 B2 * | 8/2011 | Masliah ................ | H01L 29/402 257/256 |

(Continued)

FOREIGN PATENT DOCUMENTS

| | | | | |
|---|---|---|---|---|
| WO | WO 2007/042850 | * | 4/2007 | ............. H01L 29/78 |
| WO | WO 2013/089853 | * | 6/2013 | ............. H01L 27/04 |

*Primary Examiner* — Victoria K Hall
(74) *Attorney, Agent, or Firm* — McClure, Qualey & Rodack, LLP

(57) ABSTRACT

A method of fabricating a semiconductor structure includes the following steps. A first dummy gate structure and a second dummy gate structure are formed on a semiconductor substrate. A recess is formed next to the first and the second dummy gate structure and in the semiconductor substrate. A pair of first spacers is formed adjacent to the first dummy gate structure. A pair of second spacers is formed adjacent to the second dummy gate structure. One of the first spacers extends from a first sidewall of the first dummy gate structure to a first inner sidewall of the recess. One of the second spacers extends from a second sidewall of the second dummy gate structure to a second inner sidewall of the recess. A first isolation layer is formed on a bottom surface of the recess. A first conducting layer is formed on the first isolation layer.

20 Claims, 12 Drawing Sheets

(51) Int. Cl.
H01L 21/3213 (2006.01)
H01L 27/11521 (2017.01)

(56) References Cited

U.S. PATENT DOCUMENTS

| | | | | |
|---|---|---|---|---|
| 8,652,898 | B2* | 2/2014 | Cheng | H01L 27/0629 |
| | | | | 257/E21.203 |
| 8,728,900 | B2* | 5/2014 | Chuang | H01L 27/0629 |
| | | | | 257/368 |
| 9,425,189 | B1* | 8/2016 | Moll | H01L 21/823481 |
| 9,484,263 | B1* | 11/2016 | Lin | H01L 21/823437 |
| 2008/0081472 | A1* | 4/2008 | Tanaka | H01L 21/02068 |
| | | | | 438/682 |
| 2009/0230479 | A1* | 9/2009 | Hsu | H01L 21/823842 |
| | | | | 257/369 |
| 2011/0115005 | A1 | 5/2011 | Coolbaugh et al. | |
| 2013/0112938 | A1* | 5/2013 | Bangsaruntip | B82Y 10/00 |
| | | | | 257/9 |
| 2013/0137264 | A1* | 5/2013 | Yin | H01L 21/31053 |
| | | | | 438/692 |
| 2013/0178021 | A1* | 7/2013 | Cheng | H01L 27/0629 |
| | | | | 438/155 |
| 2013/0248990 | A1* | 9/2013 | Kim | H01L 23/5384 |
| | | | | 257/330 |
| 2015/0235852 | A1* | 8/2015 | Lim | H01L 21/26506 |
| | | | | 438/305 |
| 2016/0268436 | A1* | 9/2016 | Asami | H01L 29/7869 |
| 2017/0025313 | A1* | 1/2017 | Ching | H01L 21/823807 |
| 2017/0025442 | A1* | 1/2017 | Flachowsky | H01L 27/1207 |
| 2017/0032971 | A1* | 2/2017 | Pan | H01L 21/28273 |

* cited by examiner

SEMICONDUCTOR STRUCTURE AND FABRICATING METHOD THEREOF

BACKGROUND

The semiconductor integrated circuit (IC) industry has experienced exponential growth and has progressed in pursuit of higher device density and performance as well as lower costs. In the course of IC evolution, functional density (i.e., the number of interconnected devices per chip area) has generally increased while geometry size (i.e., the smallest component that can be created using a fabrication process) has decreased. However, typical semiconductor devices face higher obstacles due to physical constraints. Accordingly, a wide variety of approaches of fabrication processes for scaling down of semiconductor device have been developed.

Among the semiconductor device, flash memory is an electronic non-volatile computer storage medium that can be electrically erased and reprogrammed. A typical flash memory includes a memory array having a large number of memory cells arranged as an array. It can be used in a wide variety of commercial and military electronic devices and equipment. Common types of flash memory cells include stacked gate memory cells and split gate memory cells. The aggressive scaling of the third generation embedded superflash memory (ESF3) enables designing flash memories with very high memory array density, lower power consumption, higher injection efficiency, and less susceptibility to short channel effects, and over erase immunity.

BRIEF DESCRIPTION OF THE DRAWINGS

Aspects of the instant disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-12A are cross-sectional views of a semiconductor structure 1200a at various stages of fabrication, in accordance with some embodiments.

FIGS. 3B-12B are cross-sectional views of a semiconductor structure 1200b at various stages of fabrication, in accordance with some embodiments.

DETAILED DESCRIPTION

Figure 1:
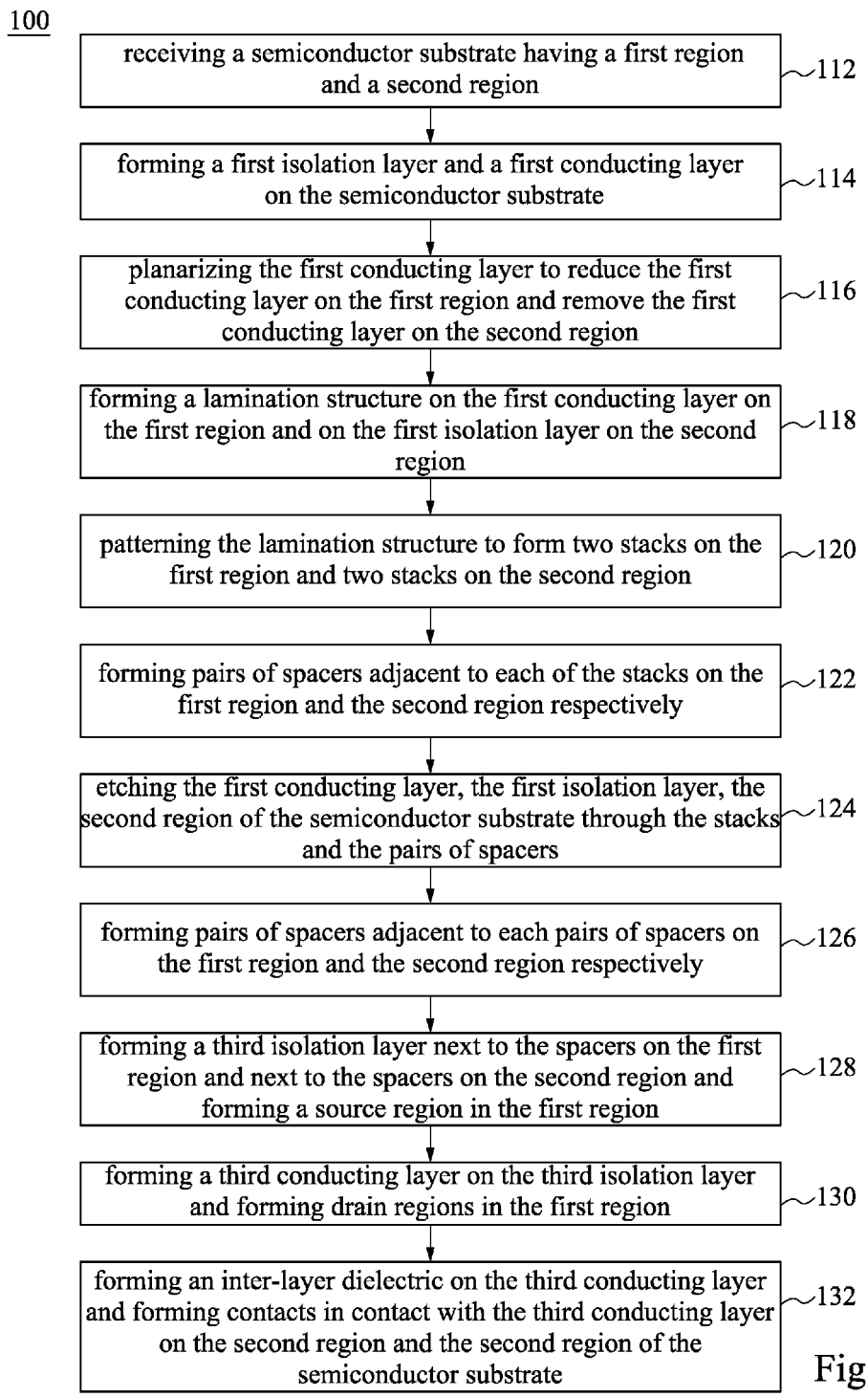
FIG. 1 shows a method 100 of fabricating a semiconductor structure, in accordance with some embodiments.

The following disclosure provides many different embodiments, or examples, for implementing different features of the provided subject matter. Specific examples of components and arrangements are described below to simplify the instant disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the instant disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices usually include capacitors serving as a charge reservoir, which is used to support instantaneous current surges, suppress power fluctuation, and prevent noise-related circuit degradation. Traditional capacitors manufactured during front end of line (FEOL) or back end of line (BEOL) are usually planar-type. In more detail, the planar capacitor usually includes two parallel conducting layers and one isolation layer sandwiched between the parallel conducting layers. The planar capacitors with high capacitance usually require a large amount of installation space in semiconductor devices. It is against the requirement of minimizing the semiconductor devices. Moreover, because it is necessary to include steps of fabricating capacitors during producing the semiconductor devices, the producing process may becomes complex. Accordingly, an improved capacitor with high capacitance is required. In addition, it is also necessary to integrate the fabricating process of capacitor and fabricating processes of other features such as flash memory cell.

The instant disclosure provides a method of fabricating a semiconductor structure. FIG. 1 shows a method 100 of fabricating a semiconductor structure, in accordance with some embodiments. Although a series of operations described in this method is disclosed, the order of these operations shown should not be construed to limit the present invention. For example, certain operations may be performed in different orders and/or concurrently with other operations. Moreover, not all operations must be performed in order to achieve the depicted embodiment of the present invention. Furthermore, each operation or procedure described herein may contain several sub-steps or actions.

Figure 2:
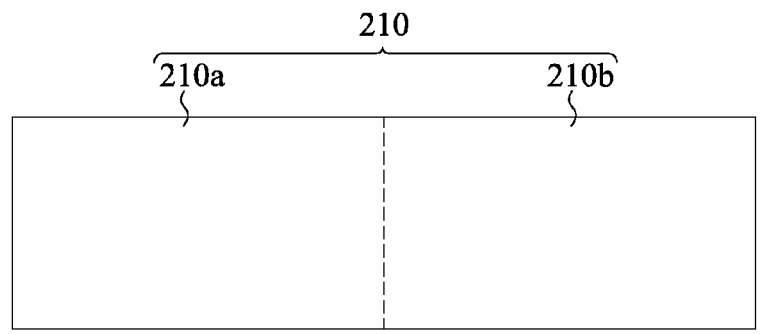
FIG. 2 is a cross-sectional view of a semiconductor substrate, in accordance with some embodiments.

FIG. 2 is a cross-sectional view of a semiconductor substrate 210, in accordance with some embodiments. Referring to FIGS. 1 and 2 at the same time, in operation 112, a semiconductor substrate 210 having a first region 210a and a second region 210b is received. The first region 210a is for forming a flash memory cell in subsequent manufacturing processes. The second region 210b is for forming a capacitor in subsequent manufacturing processes. In some embodiments, the first region 210a is next to the second region 210b. In other embodiments, a distance between the first region 210a and second region 210b is arbitrary. It should be understood that additional features may be added in the semiconductor substrate 210.

The semiconductor substrate 210 may be a bulk silicon substrate. Alternatively, the semiconductor substrate 210 may include an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. Alternatively, the semiconductor substrate 210 may be a layered semiconductor such as Si/SiGe or a silicon-on-insulator (SOI).

The subsequent manufacturing processes on the first region 210a and the second region 210b are illustrated in FIGS. 3A-12A and FIGS. 3B-12B respectively. FIGS. 3A-12A are cross-sectional views of a semiconductor structure 1200a formed on the first region 210a of the semiconductor substrate 210 at various stages of fabrication, in accordance with some embodiments. FIGS. 3B-12B are cross-sectional views of a semiconductor structure 1200b formed on the second region 210b of the semiconductor substrate 210 at various stages of fabrication, in accordance with some embodiments.

Figure 3A:
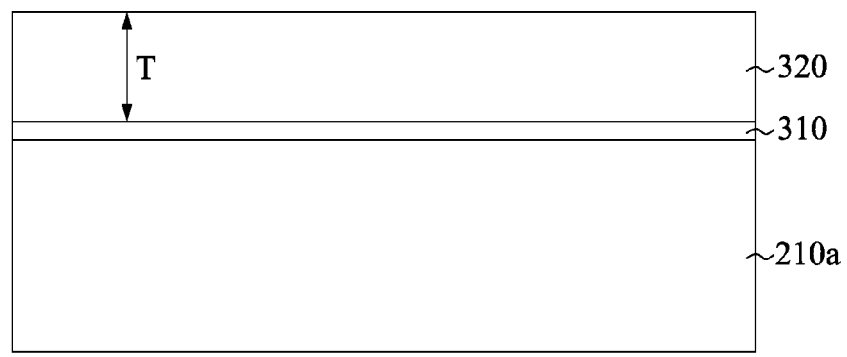
Figure 3B:
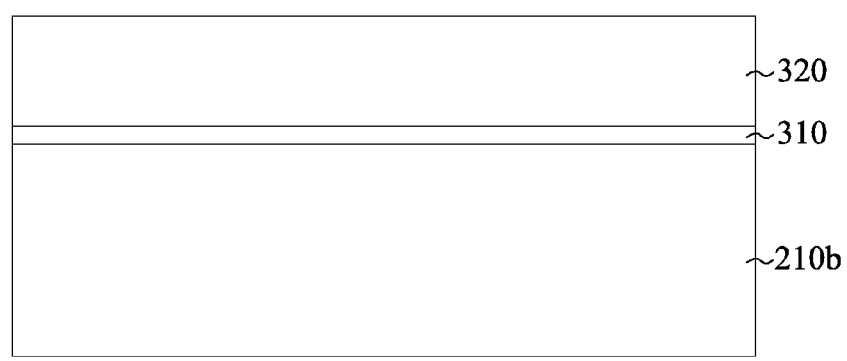

Referring to FIG. 1, FIG. 3A and FIG. 3B at the same time, in operation 114, a first isolation layer 310 is formed on the first region 210a and the second region 210b of the semiconductor substrate 210. Subsequently, a first conducting layer 320 is formed on the first isolation layer 310. In some embodiments, the first isolation layer 310 is made of any suitable oxide such as silicon dioxide ($SiO_2$), scandium oxide ($Sc_2O_3$), aluminium oxide ($Al_2O_3$), titanium oxide ($TiO_2$), barium strontium titanium oxide ($BaO_6SrTi_2$), yttrium oxide ($Y_2O_3$), zirconium oxide ($ZrO_2$), zirconium silicon oxide ($ZrSiO_4$), lanthanum oxide ($La_2O_3$), hafnium oxide ($HfO_2$), hafnium silicon oxide, tantalum pentoxide ($Ta_2O_5$), strontium titanium oxide ($SrTiO_3$), or a combination thereof. In some embodiments, the first conducting layer 320 is made of polysilicon or amorphous silicon.

Because the first region 210a is for forming a floating gate transistor in subsequent manufacturing processes, some shallow trench isolations (STIs)(not shown) may be embedded in the first region 210a and the first isolation layer 310 before the first conducting layer 320 is formed. It is worth noting that a portion of the shallow trench isolation may protrude from the first region 210a and the isolation layer 310. Therefore, the portion of the shallow trench isolation is embedded into the first conducting layer 320 during forming the first conducting layer 320. In contrast, because the structure formed on the second region 210b in subsequent manufacturing processes is unnecessary to be insulated from other structures, there is no any shallow trench isolation in the first conducting layer 320 on the second region 210b.

Figure 4A:
Figure 4B:

Referring to FIG. 1, FIG. 4A and FIG. 4B at the same time, in operation 116, the first conducting layer 320 is planarized to reduce a thickness T of the first conducting layer 320 which is on the first region 210a to form the first conducting layer 322 as shown in FIG. 4A and remove the first conducting layer 320 which is on the second region 210b as shown in FIG. 4B. Because the first conducting layer 320 on the first region 210a is embedded with a portion of the shallow trench isolation previously, the planarization process stops when the upper surface of the shallow trench isolation is exposed. Therefore, the first conducting layer 322 between the shallow trench isolation remains on the first isolation layer 310 as shown in FIG. 4A. In contrast, because there is no any shallow trench isolation in the first conducting layer 320 on the second region 210b, the first conducting layer 320 on the second region 210b is entirely removed after the planarization process is performed. In some embodiments, the first conducting layer 320 is planarized by a chemical mechanical polishing (CMP) process.

Figure 5A:
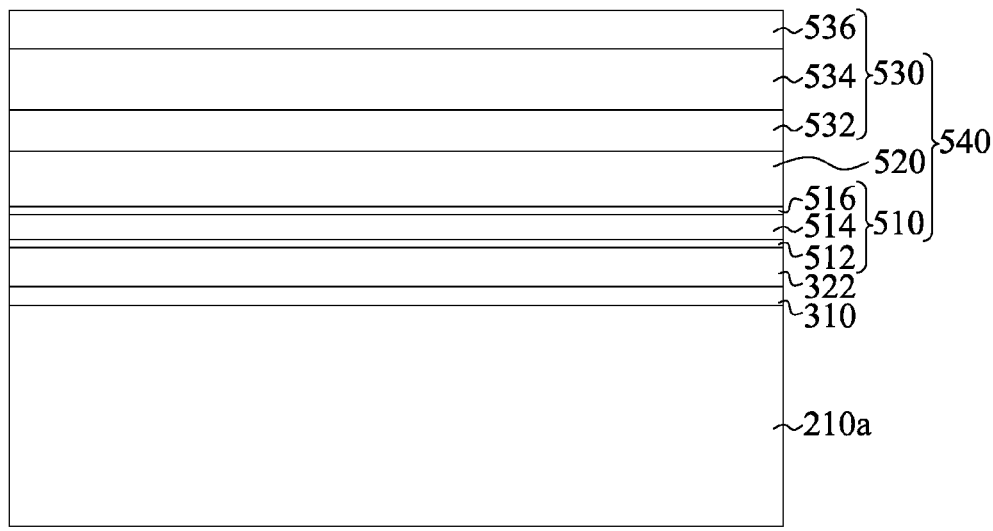
Figure 5B:
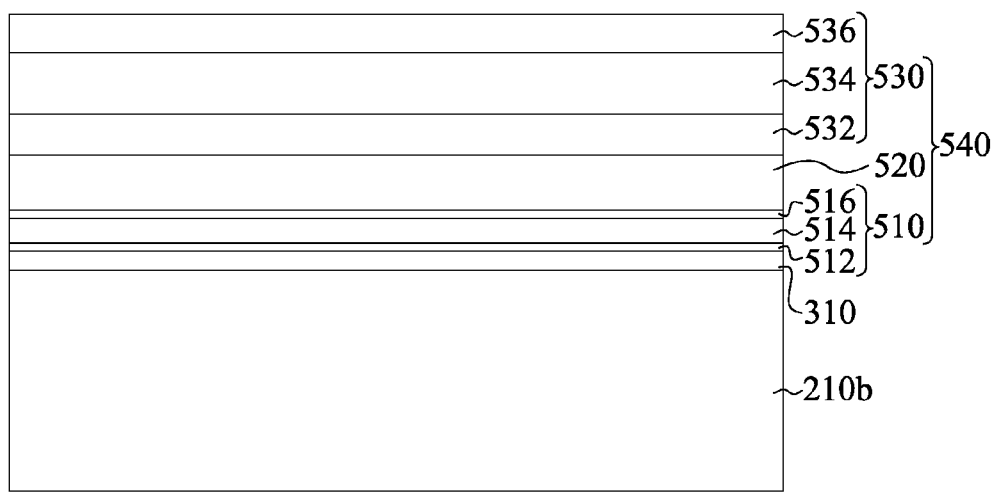

Referring to FIG. 1, FIG. 5A and FIG. 5B at the same time, in operation 118, a lamination structure 540 is formed on the first conducting layer 322 on the first region 210a and on the first isolation layer 310 on the second region 210b. The lamination structure 540 includes a second isolation layer 510, a second conducting layer 520, and a hard mask layer 530 stacked on the first conducting layer 322 in succession. The second isolation layer 510 is a composite layer and includes an oxide layer 512, a nitride layer 514, and an oxide layer 516. For example, the oxide layer 512 and the oxide layer 516 are made of silicon dioxide ($SiO_2$) and the nitride layer 514 is made of silicon nitride ($Si_3N_4$). In other embodiments, the second isolation layer 510 is a single layer and is made of any suitable dielectric material such as $SiO_2$ or $Si_3N_4$. The hard mask layer 530 is a composite layer and includes a nitride layer 532, an oxide layer 534, and a nitride layer 536. For example, the oxide layer 534 is made of silicon dioxide. The nitride layer 532 and the nitride layer 536 are made of silicon nitride. In some embodiments, the hard mask layer 530 is a single layer or stacked double layer and is made of any suitable dielectric material such as $SiO_2$ or $Si_3N_4$. For example, the stacked double layer includes an oxide layer and a nitride layer on the oxide layer. In some embodiments, the second conducting layer 520 is made of polysilicon or amorphous silicon.

Figure 6A:
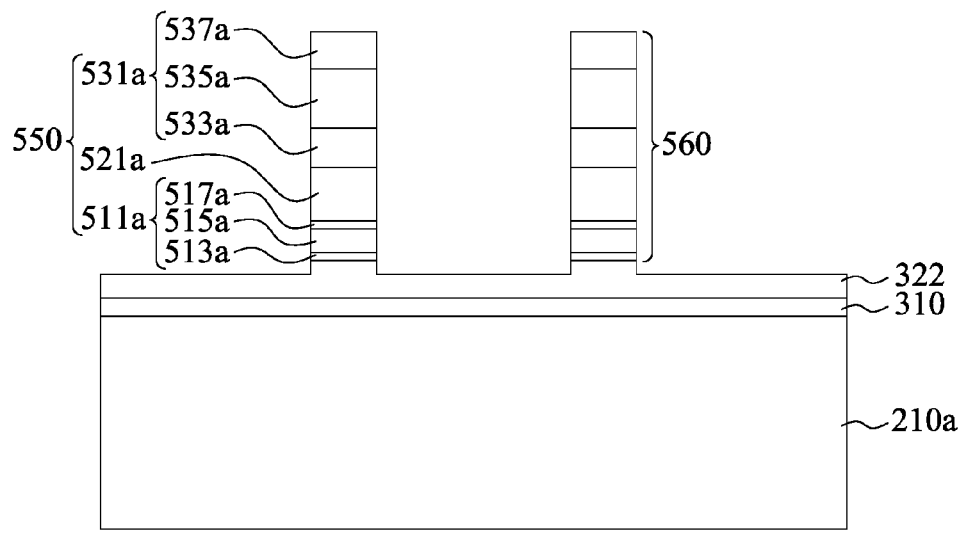
Figure 6B:
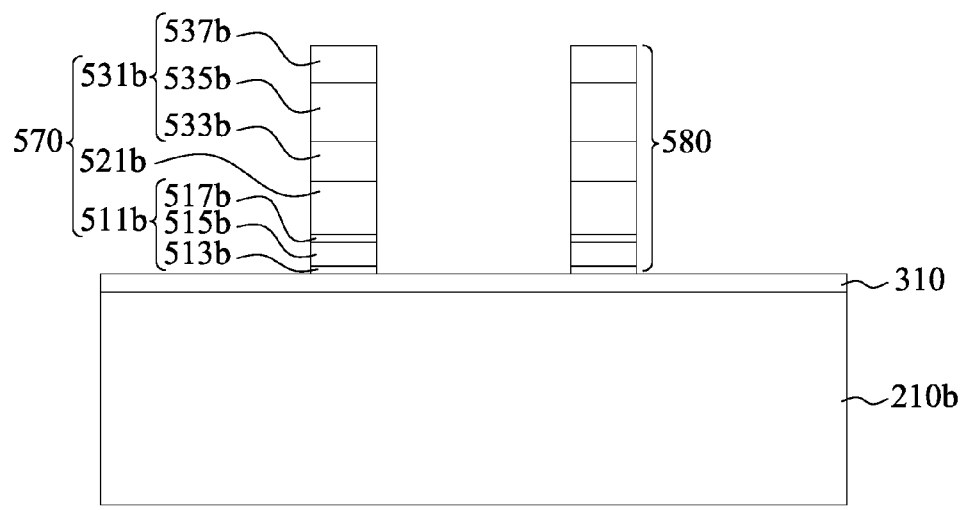

Referring to FIG. 1, FIG. 6A and FIG. 6B at the same time, in operation 120, the lamination structure 540 is patterned to expose the first conducting layer 322 on the first region 210a and to expose the first isolation layer 310 on the second region 210b. In more detail, portions of the second isolation layer 510, the second conducting layer 520, and the hard mask layer 530 are removed to form a stack 550 and a stack 560 on the first region 210a and a stack 570 and a stack 580 on the second region 210b.

In more detail, patterning the lamination structure 540 includes the following steps. Photoresist material (not shown) is deposited on the lamination structure 540 shown in FIGS. 5A and 5B, and a masking step is formed to expose selected portions of the photoresist material. Subsequently, the photoresist material is developed and used as a mask, and the lamination structure 540 is etched. The second isolation layer 510, the second conducting layer 520, and the hard mask layer 530 are then anisotropically etched, until the first conducting layer 322 on the first region 210a and the first isolation layer 310 on the second region 210b are exposed as shown in FIGS. 6A and 6B. Although only fourth "stacks": 550, 560, 570, and 580 are shown, it should be clear that there are number of such "stacks" that are separated from one another.

The stack 550 includes a second isolation layer 511a, a second conducting layer 521a, and a hard mask layer 531a. The second isolation layer 511a includes an oxide layer 513a, a nitride layer 515a, and an oxide layer 517a. The hard mask layer 531a includes a nitride layer 533a, an oxide layer 535a, and a nitride layer 537a. The stack 560 is similar to the stack 550 and thus there is unnecessary to further describe the structure of the stack 560. The stack 570 includes a second isolation layer 511b, a second conducting layer 521b, and a hard mask layer 531b. The second isolation layer 511b includes an oxide layer 513b, a nitride layer 515b, and an oxide layer 517b. The hard mask layer 531b includes a nitride layer 533b, an oxide layer 535b, and a nitride layer 537b. The stack 580 is similar to the stack 570 and thus there is unnecessary to further describe the structure of the stack 580.

Because the stack 550 and stack 570 are formed simultaneously and are made from the same lamination structure 540, it is obvious that a material of the second isolation layer 511a is the same as a material of the second isolation layer 511b, a material of the second conducting layer 521a is the same as a material of the second conducting layer 521b, and a material of the hard mask layer 531a is the same as a material of the hard mask layer 531b.

Figure 7A:
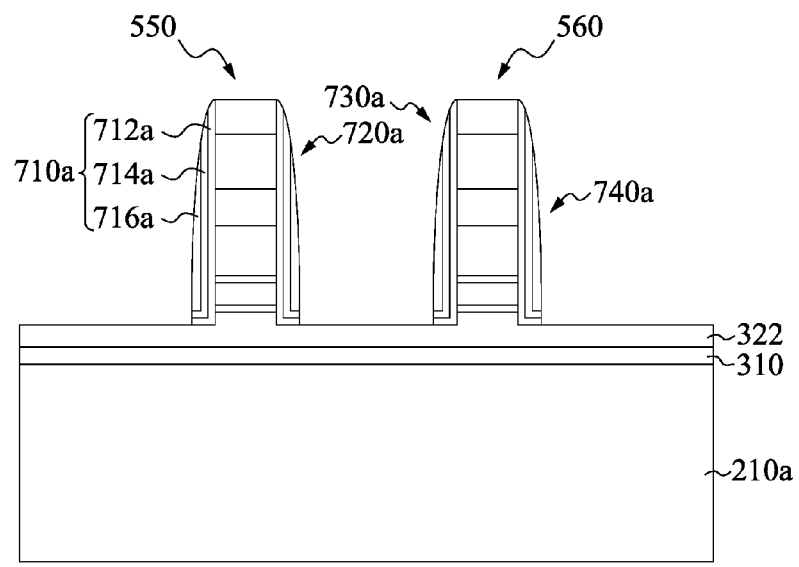
Figure 7B:
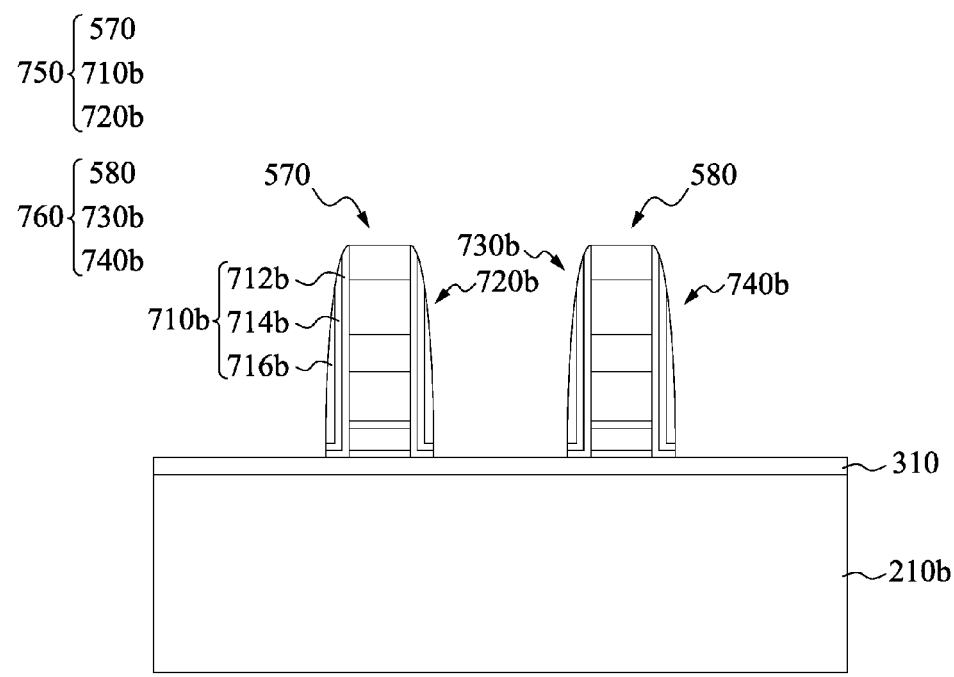

Referring to FIG. 1, FIG. 7A and FIG. 7B at the same time, in operation 122, a pair of spacers 710a, 720a, is formed adjacent to the stack 550, a pair of spacers 730a, 740a, is formed adjacent to the stack 560, a pair of spacers 710b, 720b, is formed adjacent to the stack 570, and a pair of spacers 730b, 740b, is formed adjacent to the stack 580. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface).

The spacer 710a is a composite layer and includes an oxide layer 712a, a nitride layer 714a, and an oxide layer 716a. For example, the oxide layer 712a and oxide layer 716a are made of any suitable oxide such as silicon dioxide or any high temperature oxide (HTO) and the nitride layer 714a is made of silicon nitride. In other embodiments, the spacer 710a is a single layer and is made of any suitable dielectric material such as $SiO_2$, or $Si_3N_4$. The spacer 720a, the spacer 730a, and the spacer 740a are similar to the spacer 710a and thus there is unnecessary to further describe the details.

The spacer 710b is a composite layer and includes an oxide layer 712b, a nitride layer 714b, and an oxide layer 716b. For example, the oxide layer 712b and oxide layer 716b are made of any suitable oxide such as silicon dioxide or any high temperature oxide (HTO) and the nitride layer 714b is made of silicon nitride. In other embodiments, the spacer 710b is a single layer and is made of any suitable dielectric material such as $SiO_2$, or $Si_3N_4$. The spacer 720b, the spacer 730b, and the spacer 740b are similar to the spacer 710b and thus there is unnecessary to further describe the details. The stack 570, the spacer 710b, and the spacer 720b forms a first dummy gate structure 750. The stack 580, the spacer 730b, and the spacer 740b form a second dummy gate structure 760.

Figure 8A:
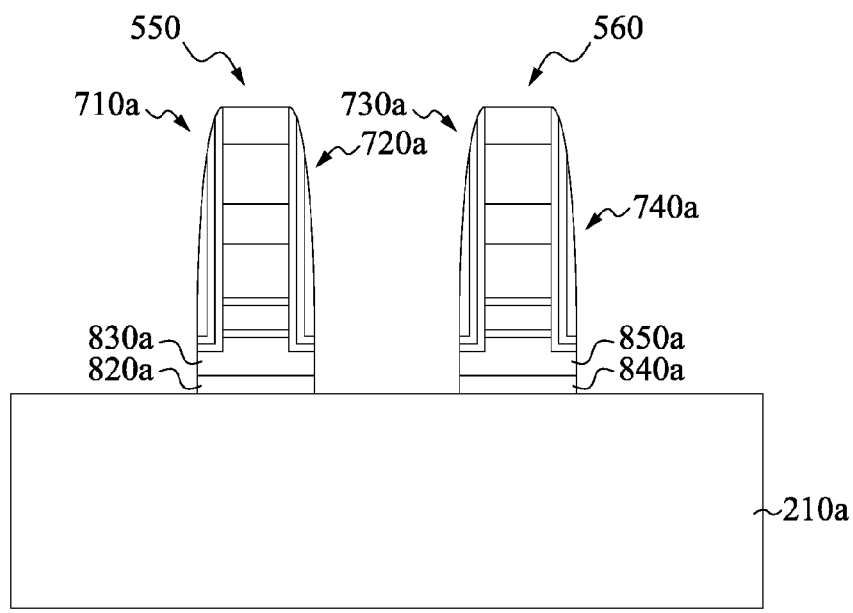
Figure 8B:
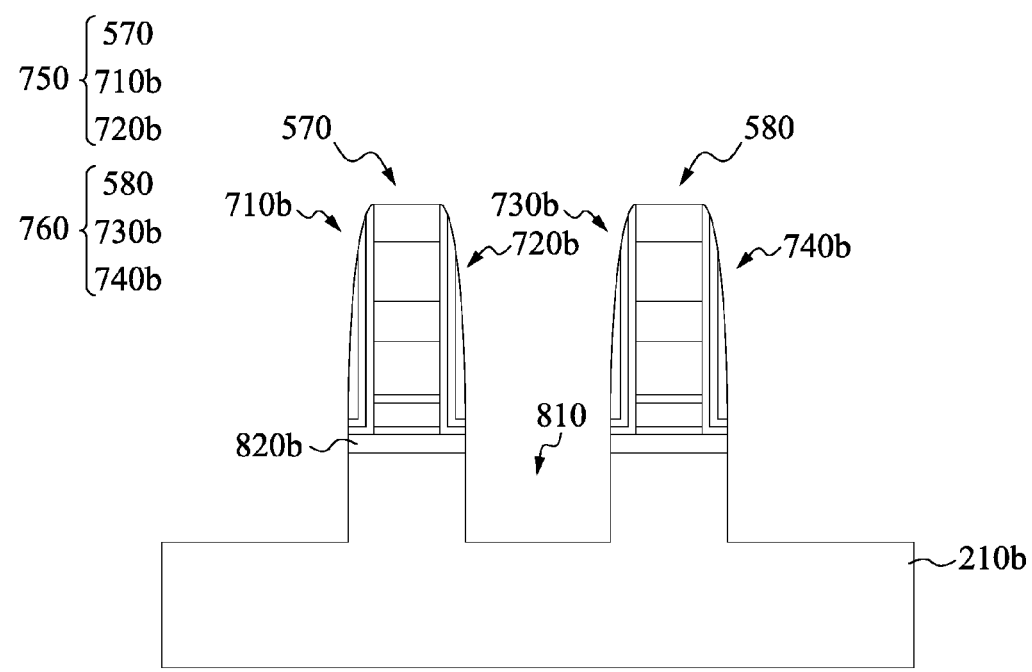

Referring to FIG. 1, FIG. 8A and FIG. 8B at the same time, in operation 124, the first conducting layer 322 and the first isolation layer 310 are etched through the stack 550, the pair of spacers 710a, 720a, the stack 560, and the pair of spacers 730a, 740a as shown in FIG. 8A. In other words, the stack 550, the pair of spacers 710a, 720a, the stack 560, and the pair of spacers 730a, 740a are used as hard mask during etching. Moreover, the first isolation layer 310 and the second region 210b of the semiconductor substrate 210 are etched through the first dummy gate structure 750 and the second dummy gate structure 760 to form a recess 810 next to the first dummy gate structure 750 and the second dummy gate structure 760 and in the second region 210b as shown in FIG. 8B. In other words, the first dummy gate structure 750 and the second dummy gate structure 760 are used as hard mask during etching. In more detail, portions of the first isolation layer 310 and the second region 210b of the semiconductor substrate 210 are removed to form the recess 810. The recess 810 is between and adjacent to the first dummy gate structure 750 and the second dummy gate structure 760. In some embodiments, the first conducting layer 322, the first isolation layer 310, and the second region 210b of the semiconductor substrate 210 are etched simultaneously. In some embodiments, the above etching process can be performed by dry etching or wet etching.

The first conducting layer 322 and the first isolation layer 310 as shown in FIG. 7A are patterned to form a first isolation layer 820a and a first conducting layer 830a, a first isolation layer 840a, and a first conducting layer 850a as shown in FIG. 8A. The first isolation layer 310 as shown in FIG. 7B is patterned to form a first isolation layer 820b as shown in FIG. 8B.

Figure 9A:
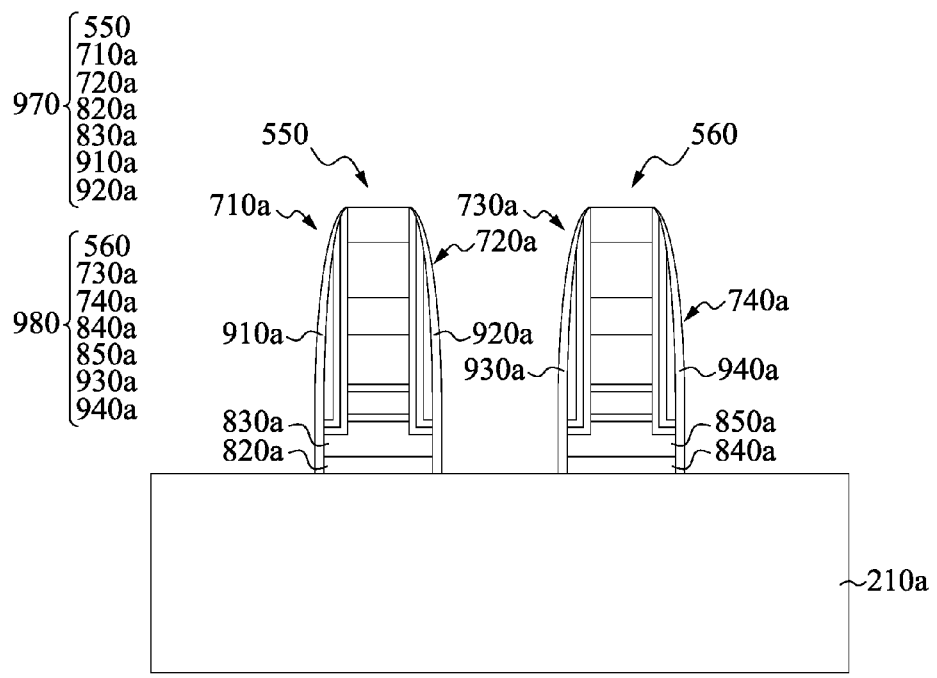
Figure 9B:
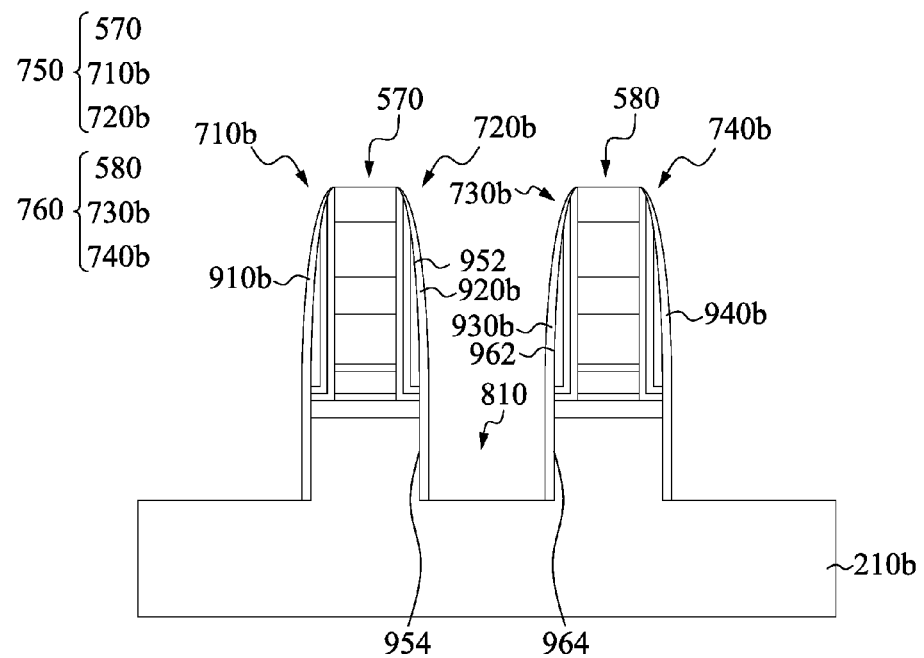

Referring to FIG. 1, FIG. 9A and FIG. 9B at the same time, in operation 126, a pair of spacers 910a, 920a, is formed adjacent to the pair of spacers 710a, 720a to form a floating gate structure 970. The floating gate structure 970 includes the stack 550, the pair of spacers 710a, 720a, the first isolation layer 820a, the first conducting layer 830a, and the pair of spacers 910a, 920a. A pair of spacers 930a, 940a, is formed adjacent to the pair of spacers 730a, 740a to form a floating gate structure 980. The floating gate structure 980 includes the stack 560, the pair of spacers 730a, 740a, the first isolation layer 840a, the first conducting layer 850a, and the pair of spacers 930a, 940a. Moreover, a pair of spacers 910b, 920b, is formed adjacent to the pair of spacers 710b, 720b, and a pair of spacers 930b, 940b, is formed adjacent to the pair of spacers 730b, 740b. In some embodiments, the pair of spacers 910a, 920a, the pair of spacers 930a, 940a, the pair of spacers 910b, 920b and the pair of spacers 930b, 940b are formed simultaneously. As shown in FIG. 9B, the pair of spacers 910b, 920b is adjacent to the first dummy gate structure 750 and the pair of spacers 930b, 940b is adjacent to the second dummy gate structure 760. The spacer 920b extends from a first sidewall 952 of the first dummy gate structure 750 to a first inner sidewall 954 of the recess 810. The spacer 930b extends from a second sidewall 962 of the second dummy gate structure 760 to a second inner sidewall 964 of the recess 910.

Figure 10A:
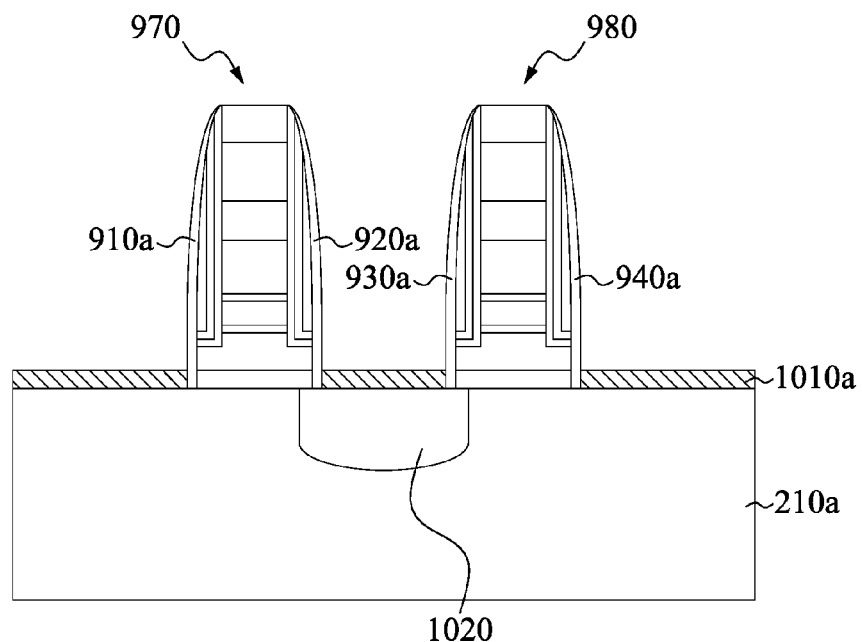
Figure 10B:
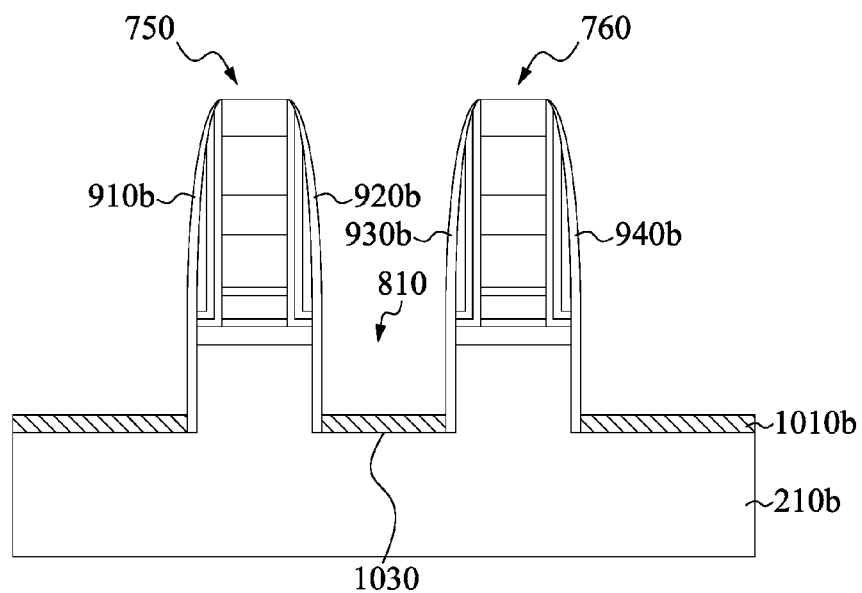

Referring to FIG. 1, FIG. 10A and FIG. 10B at the same time, in operation 128, a third isolation layer 1010a is formed on the first region 210a and next to the pair of spacers 910a, 920a, and the pair of spacers 930a, 940a. In other words, the third isolation layer 1010a is next to the floating gate structure 970 and floating gate structure 980. Moreover, a third isolation layer 1010b is formed adjacent to the pair of spacers 910b, 920b, and the pair of spacers 930b, 940b. In more detail, a portion of the third isolation layer 1010b is on a bottom surface 1030 of the recess 810. In some embodiments, the third isolation layer 1010a and the third isolation layer 1010b are formed simultaneously. The third isolation layer 1010a and the third isolation layer 1010b are made of any suitable oxide such as silicon dioxide ($SiO_2$), scandium oxide ($Sc_2O_3$), aluminium oxide ($Al_2O_3$), titanium oxide ($TiO_2$), barium strontium titanium oxide ($BaO_6SrTi_2$), yttrium oxide ($Y_2O_3$), zirconium oxide ($ZrO_2$), zirconium silicon oxide ($ZrSiO_4$), lanthanum oxide ($La_2O_3$), hafnium oxide ($HfO_2$), hafnium silicon oxide, tantalum pentoxide ($Ta_2O_5$), strontium titanium oxide ($SrTiO_3$), or a combination thereof. Moreover, a source region 1020 is formed in the first region as shown in FIG. 10A. Specifically, the source region 1020 is between and adjacent to the floating gate structure 970 and floating gate structure 980.

Figure 11A:
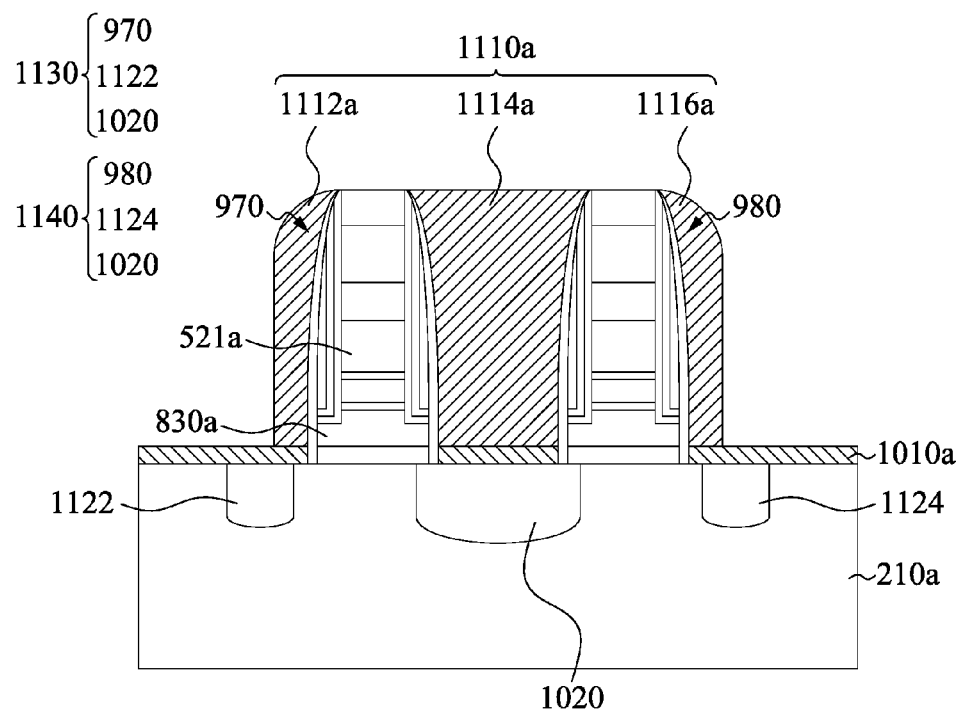
Figure 11B:
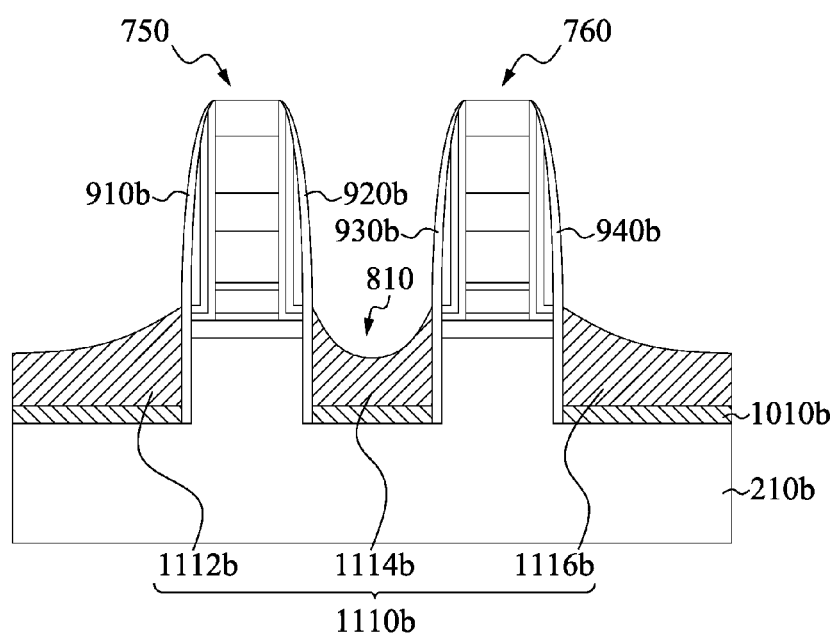

Referring to FIG. 1, FIG. 11A and FIG. 11B at the same time, in operation 130, a third conducting layer 1110a is formed on the third isolation layer 1010a and surrounds the floating gate structure 970 and floating gate structure 980. Moreover, a third conducting layer 1110b is formed on the third isolation layer 1010b and next to the pair of spacers 910b, 920b, and the pair of spacer 930b, 940b. In some embodiments, the third conducting layer 1110a and the third conducting layer 1110b are formed simultaneously. In some embodiments, the third conducting layer 1110a and the third conducting layer 1110b are made of polysilicon. Moreover, drain regions 1122, 1124 are formed in the first region as shown in FIG. 11A. Specifically, the drain regions 1122, 1124 are adjacent to the floating gate structure 970 and floating gate structure 980.

As shown in FIG. 11A, a split-gate flash memory cell is formed. The split-gate flash memory cell includes two adjacent floating gate transistors 1130, 1140. The floating gate transistor 1130 includes the floating gate structure 970, the source region 1020, and the drain region 1122. The floating gate transistor 1140 includes the floating gate structure 980, the source region 1020, and the drain region 1124. The source region 1020 is shared between two adjacent floating gate transistors 1130, 1140. Generally, a floating gate transistor has two gates, a floating gate and a control gate. The first conducting layer 830a is used as a floating gate of the floating gate transistor 1130. The second conducting layer 521a is used as a control gate of the floating gate transistor 1130. Such split-gate flash memory cell in FIG. 11A is a third generation embedded super-flash memory (ESF3).

Further, the third conducting layer 1110a includes third portions, a select gate 1112a, an erase gate 1114a, and a select gate 1116a. The erase gate 1114a is disposed over the source region 1020 and shared between two adjacent floating gate transistors 1130, 1140. The select gate 1112a and 1116a are disposed on the drain regions 1122, 1124 and also referred to as word line (WL).

As shown in FIG. 11B, the third conducting layer 1110b includes a first portion 1112b, a second portion 1114b, and a third portion 1116b. The second portion 1114b of the third conducting layer 1110b is isolated from the second region 210b of the semiconductor substrate 210 with the third isolation layer 1010b, the spacer 920b, and the spacer 930b. Therefore, the second portion 1114b, the third isolation layer 1010b, the spacer 920b, the spacer 930b, and the second region 210b of the semiconductor substrate 210 form a capacitor.

Figure 12A:
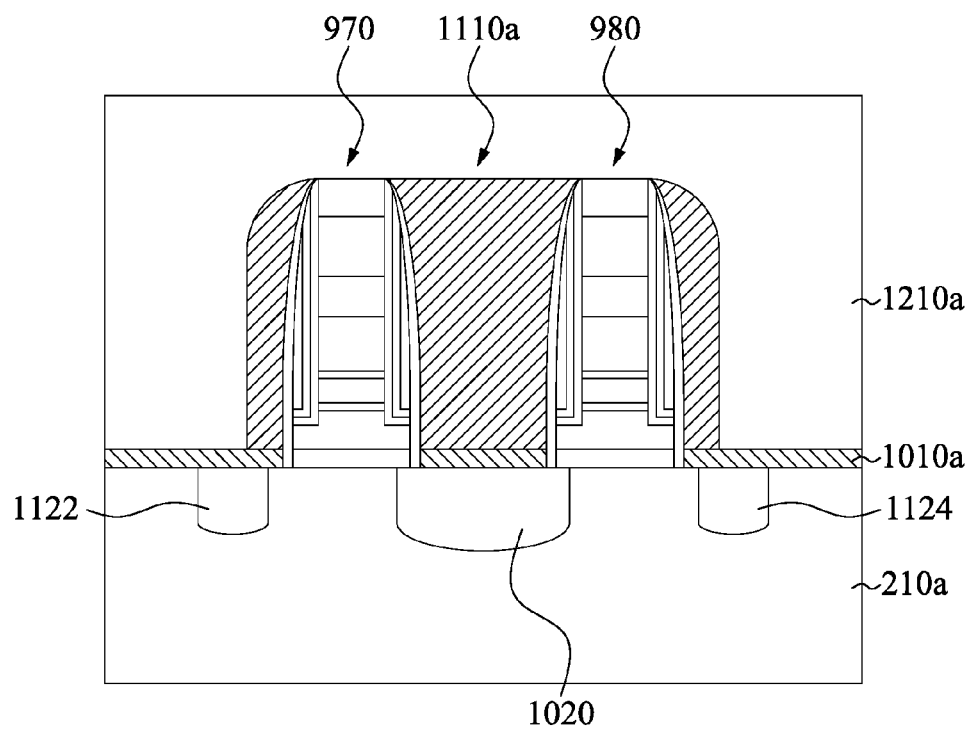
Figure 12B:
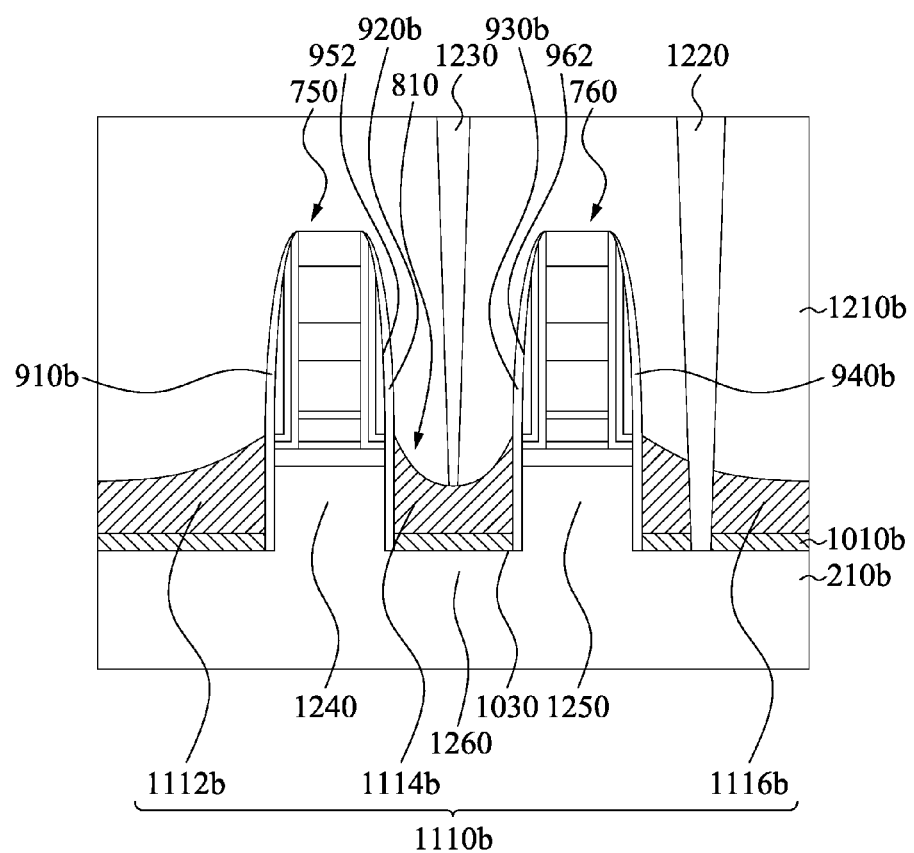

Referring to FIG. 1, FIG. 12A and FIG. 12B at the same time, in operation 132, an inter-layer dielectric 1210a is formed entirely over the third conducting layer 1110a, third isolation layer 1010a, the floating gate structure 970, and floating gate structure 980 and covers their top surfaces as well as surrounding them to form the semiconductor structure 1200a. It should be understood that additional features may be added in the semiconductor structure 1200a. Moreover, an inter-layer dielectric 1210b is formed entirely over the third conducting layer 1110b, the pair of spacers 910b, 920b, the pair of spacers 930b, 940b, the first dummy gate structure 750, and the second dummy gate structure 760 and covers their top surfaces as well as surrounding them. In some embodiments, the inter-layer dielectric 1210a and the inter-layer dielectric 1210b are formed simultaneously. Moreover, a first contact 1220 is formed in contact with the second region 210b of the semiconductor substrate 210 and a second contact 1230 is formed in contact with the third conducting layer 1110a to form the semiconductor structure 1200b. The position of the first contact 1220 and the second contact 1230 in the inter-layer dielectric 1210b is arbitrary.

As shown in FIG. 12B, in the semiconductor structure 1200b, the second region 210b of the semiconductor substrate 210 has a first protruding portion 1240, a second protruding portion 1250, and a recess portion 1260. The recess portion 1260 is between and adjacent to the first protruding portion 1240 and the second protruding portion 1250. The first dummy gate structure 750 is on the first protruding portion 1240. The second dummy gate structure 760 is on the second protruding portion 1250. The pair of spacers 910b, 920b, is adjacent to the first dummy gate structure 750. The spacer 920b is adjacent to the first protruding portion 1240 and the first sidewall 952 of the first dummy gate structure 750. The pair of spacers 930b, 940b is adjacent to the second dummy gate structure 760. The spacer 930b is adjacent to the second protruding portion 1250 and the second sidewall 962 of the second dummy gate structure 760. A portion of the third isolation layer 1010b is on an upper surface of the recess portion 1260 (i.e. the bottom surface 1030 of the recess 810). The third conducting layer 1110b is on the third isolation layer 1010b.

The second portion 1114b of the third conducting layer 1110b, the third isolation layer 1010b, the spacer 920b, the spacer 930b, and the second region 210b of the semiconductor substrate 210 form a capacitor. Depending on requirement of different structural designs, the depth of the recess 810, the thicknesses of the third isolation layer 1010b, the spacer 920b, and the spacer 930b, and the thickness of second portion 1114b of the third conducting layer 1110b can be easily adjusted during fabricating process to provide different capacitance. Compared to general planar-type capacitor, the capacitor shown in FIG. 12B can have higher capacitance but smaller occupation volume. It is beneficial for achieving the object of minimizing semiconductor devices. Moreover, from the FIGS. 3A-12A and 12A-12B, it is obvious that fabricating process of capacitor and fabricating process of flash memory cell can be performed concurrently. In other words, the capacitor shown in FIG. 12B can be formed by a general flash process. Because it is unnecessary to design additional masks or steps for forming capacitors, fabricating processes of capacitor and flash memory cell of the instant disclosure have advantages such as simple process and low process cost.

In various embodiments of the instant disclosure, a method of fabricating a semiconductor structure includes the following steps. A semiconductor substrate is received. A first dummy gate structure and a second dummy gate structure are formed on the semiconductor substrate. A recess is formed next to the first dummy gate structure and the second dummy gate structure and in the semiconductor substrate. A pair of first spacers is formed adjacent to the first dummy gate structure. A pair of second spacers is formed adjacent to the second dummy gate structure. One of the first spacers extends from a first sidewall of the first dummy gate structure to a first inner sidewall of the recess. One of the second spacers extends from a second sidewall of the second dummy gate structure to a second inner sidewall of the recess. A first isolation layer is formed on a bottom surface of the recess. A first conducting layer is formed on the first isolation layer.

In various embodiments of the instant disclosure, a method of fabricating a semiconductor structure includes the following steps. A semiconductor substrate having a first region and a second region is received. A first isolation layer is formed on the semiconductor substrate. A first conducting layer is formed on the first region. A lamination structure is formed on the first conducting layer and on the first isolation layer on the second region and includes a second isolation layer, a second conducting layer, and a hard mask layer stacked on the first conducting layer in succession. The lamination structure is patterned to expose the first conducting layer on the first region and the first isolation layer on the second region, such that a first stack is formed on the first conducting layer on the first region and a second stack and a third stack are formed on the second region. A pair of first spacers is formed adjacent to the first stack. A pair of second spacers is formed adjacent to the second stack to form a first dummy gate structure. A pair of third spacers is formed adjacent to the third stack to form a second dummy gate structure. The first conducting layer and the first isolation layer are etched through the first stack and the pair of first spacers. The first isolation layer and the semiconductor substrate are etched through the first dummy gate structure and the second dummy gate structure to form a recess between the first dummy gate structure and the second dummy gate structure in the semiconductor substrate. A pair of fourth spacers is formed adjacent to the first dummy gate structure. A pair of fifth spacers is formed adjacent to the second dummy gate structure. One of the fourth spacers extends from a first sidewall of the first dummy gate structure to a first inner sidewall of the recess. One of the fifth spacers extends from a second sidewall of the second dummy gate structure to a second inner sidewall of the recess. A third isolation layer is formed on a bottom surface of the recess. A third conducting layer is formed on the third isolation layer.

In various embodiments of the instant disclosure, a semiconductor structure includes a semiconductor substrate, a first dummy gate structure, a second dummy gate structure, a pair of first spacers, a pair of second spacers, a first isolation layer, and a first conducting layer. The semiconductor substrate has a first protruding portion, a second protruding portion, and a recess portion. The recess portion is between and adjacent to the first protruding portion and the second protruding portion. The first dummy gate structure is on the first protruding portion. The second dummy gate structure is on the second protruding portion. The pair of first spacers is adjacent to the first dummy gate structure. One of the first spacers is adjacent to the first protruding portion and a first sidewall of the first dummy gate structure. The pair of second spacers is adjacent to the second dummy gate structure. One of the second spacers is adjacent to the second protruding portion and a second sidewall of the second dummy gate structure. The first isolation layer is on an upper surface of the recess portion. The first conducting layer is on the first isolation layer.

The foregoing outlines features of several embodiments so that those skilled in the art may better understand the aspects of the instant disclosure. Those skilled in the art should appreciate that they may readily use the instant disclosure as a basis for designing or modifying other processes and structures for carrying out the same purposes and/or achieving the same advantages of the embodiments introduced herein. Those skilled in the art should also realize that such equivalent constructions do not depart from the spirit and scope of the instant disclosure, and that they may make various changes, substitutions, and alterations herein without departing from the spirit and scope of the instant disclosure.

What is claimed is:
1. A method of fabricating a semiconductor structure, comprising:
  receiving a semiconductor substrate;
  forming a first dummy gate structure and a second dummy gate structure on the semiconductor substrate;
  forming a recess next to the first dummy gate structure and the second dummy gate structure and in the semiconductor substrate;
  forming a pair of first spacers adjacent to the first dummy gate structure and a pair of second spacers adjacent to the second dummy gate structure, one of the first spacers extending from a first sidewall of the first dummy gate structure to a first inner sidewall of the recess, and one of the second spacers extending from a second sidewall of the second dummy gate structure to a second inner sidewall of the recess;
  forming a first isolation layer on a bottom surface of the recess; and
  forming a first conducting layer on the first isolation layer.

2. The method of claim 1, wherein forming the first dummy gate structure and the second dummy gate structure comprises:
  forming a second isolation layer on the semiconductor substrate;
  forming a second conducting layer on the second isolation layer;
  forming a hard mask layer on the second conducting layer;
  removing portions of the second isolation layer, the second conducting layer, and the hard mask layer to form a first stack and a second stack on the semiconductor substrate; and
  forming a pair of third spacers adjacent to the first stack and a pair of fourth spacers adjacent to the second stack.

3. The method of claim 1, further comprising forming a second isolation layer on the semiconductor substrate before forming the first dummy gate structure and the second dummy gate structure.

4. The method of claim 3, wherein forming the recess in the semiconductor substrate comprises removing portions of the second isolation layer and the semiconductor substrate.

5. The method of claim 1, further comprising forming a first contact in contact with the semiconductor substrate and a second contact in contact with the first conducting layer.

6. The method of claim 5, further comprising forming an inter-layer dielectric on the first conducting layer before forming the first contact in contact with the semiconductor substrate and the second contact in contact with the first conducting layer.

7. A method of fabricating a semiconductor structure, comprising:
  receiving a semiconductor substrate having a first region and a second region;
  forming a first isolation layer on the semiconductor substrate;
  forming a first conducting layer on the first region;
  forming a lamination structure on the first conducting layer on the first region and on the first isolation layer on the second region, and the lamination structure comprising a second isolation layer, a second conducting layer, and a hard mask layer stacked on the first conducting layer in succession;
  patterning the lamination structure to expose the first conducting layer on the first region and the first isolation layer on the second region, such that a first stack is formed on the first conducting layer on the first region and a second stack and a third stack are formed on the second region;
  forming a pair of first spacers adjacent to the first stack, a pair of second spacers adjacent to the second stack to form a first dummy gate structure, and a pair of third spacers adjacent to the third stack to form a second dummy gate structure;
  etching the first conducting layer and the first isolation layer through the first stack and the pair of first spacers and etching the first isolation layer and the semiconductor substrate through the first dummy gate structure and the second dummy gate structure to form a recess between the first dummy gate structure and the second dummy gate structure in the semiconductor substrate;

forming a pair of fourth spacers adjacent to the first dummy gate structure and a pair of fifth spacers adjacent to the second dummy gate structure, one of the fourth spacers extending from a first sidewall of the first dummy gate structure to a first inner sidewall of the recess, and one of the fifth spacers extending from a second sidewall of the second dummy gate structure to a second inner sidewall of the recess;

forming a third isolation layer on a bottom surface of the recess; and forming a third conducting layer on the third isolation layer.

8. The method of claim 7, further comprising forming a pair of sixth spacers adjacent to the pair of first spacers when forming the pair of fourth spacers adjacent to the first dummy gate structure and the pair of fifth spacers adjacent to the second dummy gate structure.

9. The method of claim 8, further comprising forming a fourth isolation layer next to the pair of sixth spacers and on the first region of the semiconductor substrate when forming the third isolation layer on the bottom surface of the recess.

10. The method of claim 9, further comprising forming a fourth conducting layer on the fourth isolation layer, when forming the third conducting layer on the third isolation layer.

11. The method of claim 7, further comprising forming a first contact in contact with the second region of the semiconductor substrate and a second contact in contact with the third conducting layer.

12. The method of claim 7, wherein forming the first conducting layer on the first region comprises:

forming a conducting layer on the first region and the second region; and planarizing the conducting layer to reduce a thickness of the conducting layer which is on the first region to form the first conducting layer and remove the conducting layer which is on the second region.

13. A semiconductor structure, comprising:

a semiconductor substrate having a first protruding portion, a second protruding portion, and a recess portion, and the recess portion between and adjacent to the first protruding portion and the second protruding portion;

a first dummy gate structure on the first protruding portion;

a second dummy gate structure on the second protruding portion;

a pair of first spacers adjacent to the first dummy gate structure and one of the first spacers adjacent to the first protruding portion and a first sidewall of the first dummy gate structure;

a pair of second spacers adjacent to the second dummy gate structure and one of the second spacers adjacent to the second protruding portion and a second sidewall of the second dummy gate structure;

a first isolation layer on an upper surface of the recess portion; and a first conducting layer on the first isolation layer.

14. The semiconductor structure of claim 13, wherein the first dummy gate structure comprises:

a first stack on the first protruding portion, and the first stack comprising:

a second isolation layer on the first protruding portion;

a second conducting layer on the second isolation layer; and a first hard mask layer on the second conducting layer; and a pair of third spacers adjacent to the first stack.

15. The semiconductor structure of claim 14, further comprising a floating gate transistor, the semiconductor substrate having a first region and a second region, the floating gate transistor on the first region, the second region having the first protruding portion, the second protruding portion, and the recess portion, and the floating gate transistor comprising:

a floating gate structure comprising:

a third isolation layer on the semiconductor substrate;

a floating gate on the third isolation layer;

a fourth isolation layer on the floating gate;

a control gate on the fourth isolation layer;

a second hard mask layer on the control gate; and a pair of fourth spacers adjacent to the floating gate and the control gate; and a pair of fifth spacers adjacent to the pair of fourth spacers; and source/drain regions adjacent to the pair of fifth spacers in the semiconductor substrate.

16. The semiconductor structure of claim 15, wherein a material of the second isolation layer is the same as a material of the fourth isolation layer.

17. The semiconductor structure of claim 15, wherein a material of the second conducting layer is the same as a material of the control gate.

18. The semiconductor structure of claim 15, wherein a material of the first hard mask layer is the same as the second hard mask layer.

19. The semiconductor structure of claim 15, further comprising a fifth isolation layer between the first dummy gate structure and the first protruding portion.

20. The semiconductor structure of claim 19, wherein a material of the fifth isolation layer is the same as a material of the third isolation layer.

* * * * *